(12) United States Patent
Aikawa et al.

(10) Patent No.: US 6,798,305 B2
(45) Date of Patent: Sep. 28, 2004

(54) HIGH FREQUENCY OSCILLATOR USING TRANSMISSION LINE RESONATOR

(75) Inventors: Masayoshi Aikawa, 26-11, Nara 2-chome, Aoba-ku, Yokohama-shi, Kanagawa (JP); Takayuki Tanaka, Saga (JP); Fumio Asamura, Saitama (JP); Takeo Oita, Saitama (JP)

(73) Assignees: Nibon Dempa Kogyo Co., Ltd., Tokyo (JP); Masayoshi Aikawa, Kanagawa (JP)

( * ) Notice: Subject to any disclaimer, the term of this patent is extended or adjusted under 35 U.S.C. 154(b) by 0 days.

(21) Appl. No.: 10/293,150

(22) Filed: Nov. 13, 2002

(65) Prior Publication Data

US 2003/0090332 A1 May 15, 2003

(30) Foreign Application Priority Data

Nov. 14, 2001 (JP) ........................................ 2001-349441

(51) Int. Cl.[7] .............................................. H03B 7/12
(52) U.S. Cl. ............................. 331/117 D; 331/107 SL
(58) Field of Search ....................... 331/117 D, 117 FE, 331/107 SL, 107 DP, 100, 96; 333/219, 204; 330/295

(56) References Cited

U.S. PATENT DOCUMENTS

| | | | | |
|---|---|---|---|---|
| 5,250,910 A | * | 10/1993 | Yabuki et al. | ................ 331/56 |
| 5,289,139 A | * | 2/1994 | Fiedziuszko et al. | ......... 331/56 |
| 5,402,087 A | * | 3/1995 | Gorczak | ................. 331/117 D |

* cited by examiner

Primary Examiner—Robert Pascal
Assistant Examiner—Joseph Chang
(74) Attorney, Agent, or Firm—Katten Muchin Zavis Rosenman

(57) ABSTRACT

A high frequency oscillator suitable for implementing a push-push oscillator, a push-pull oscillator, and a four-phase push-push oscillator comprises a transmission line resonator, two active devices for oscillation connected to two resonant wave points, respectively, located on the transmission line resonator in an opposite phase relationship to each other, and a combiner line connected to an electric symmetric point of the transmission line resonator. The respective active devices constitute two oscillation systems, respectively, which share the transmission line resonator as a high frequency resonator. The combiner line combines outputs from the respective oscillation systems to generate a high frequency output.

34 Claims, 17 Drawing Sheets

HIGH FREQUENCY OSCILLATOR USING TRANSMISSION LINE RESONATOR

BACKGROUND OF THE INVENTION

1. Field of the Invention

The present invention relates to a high frequency oscillator for use in a microwave band or a millimeter band, and more particularly, to a circuit configuration which can implement a push-push oscillator for generating a signal at a frequency twice as high as an oscillation frequency and a push-pull oscillator for combining oscillation outputs, and improve the performance of these oscillators.

2. Description of the Related Arts

A high frequency oscillator for use in a microwave band or a millimeter band is a core component among others in high frequency hardware, and simultaneously accounts for a large proportion of the device cost in the high frequency hardware, so that higher performance and economization are required for the high frequency oscillator. Particularly, a high frequency oscillator for use in a millimeter-wave region of 30 GHz or higher experiences lower oscillation power and deteriorated noise characteristic associated with a degraded performance of semiconductor devices and an increased circuit loss, and encounters difficulties in a reduction in the cost because a highly accurate assembling process, a high frequency testing process, and the like are required for manufacturing such a high frequency oscillator. These disadvantages also constitute main factors which impede the progress in applications of radio waves in the millimeter band. Remedies contemplated for the impediment may include the use of multiple oscillator elements, power combination based on a push-pull operation, oscillation of a high frequency twice as high as a fundamental frequency through push-push oscillation, and the like.

FIG. 1 illustrates the configuration of a conventional high frequency oscillator. This high frequency oscillator comprises dielectric resonator 2X as a high frequency (microwave) resonator installed on substrate 1; two active devices 3 for oscillation each including negative resistance elements, amplifier elements, and circuits associated therewith; and combiner circuit 4. Two active devices 3 each employ, for example, an FET (field effect transistor) as an amplifier element, and share dielectric resonator 2X to form two oscillation systems. A ground conductor (not shown) is deposited substantially over the entire back surface of substrate 1.

Each FET 3 has a gate connected to one end of associated microstrip line 5. These microstrip lines 5 are positioned on both sides of dielectric resonator 2X and electromagnetically coupled to the same. Each microstrip line 5 has the other end grounded through terminal resistor 10. FET 3, the source of which is grounded, generates an oscillation output at its drain Here, the respective oscillation systems are designed to oscillate in opposite phase to each other, so that two FETs 3 provide oscillation outputs in opposite phase at their drains.

The drains of respective FETs 3 are connected to combiner circuit 4. Combiner circuit 4 comprises a Wilkinson type power combiner circuit when it is designed, for example, for in-phase combination, and additionally includes a phase inversion circuit connected to one input of the Wilkinson type power combiner circuit when it is designed for antiphase combination. Combiner circuit 4 receives and combines respective oscillation outputs from the drains of the active devices for oscillation, i.e., FETs 3.

For example, for configuring a push-push oscillator which generates oscillation frequency $2f_0$ twice as high as oscillation frequency $f_0$ in each oscillation system, combiner circuit 4 receives oscillation outputs from respective FETs 3 as they are, and combines the oscillation outputs in phase. In this event, since FETs 3 themselves have oscillation outputs in opposite phase to each other, the fundamental component $f_0$ and its odd-numbered harmonic components in the oscillation output of each oscillation system are canceled out, while second-order and higher even-numbered harmonic components are combined and delivered from the output of combiner circuit 4. FIGS. 2A to 2C show the waveforms observed around combiner circuit 4 when the circuit illustrated in FIG. 1 is used as a push-push oscillator. FIGS. 2A and 2B show the waveforms at two input terminals of combiner circuit 4, respectively, while FIG. 2C shows the waveform at the output of combiner circuit 4.

When the high frequency oscillator illustrated in FIG. 1 is designed to function as a push-pull oscillator for generating combined output $P_o$ from the oscillation outputs of both oscillation systems at an output frequency remaining equal to fundamental frequency $f_0$, combiner circuit 4 is configured to perform an antiphase combination. Specifically, for the antiphase combination, combiner circuit 4 combines the oscillation output from one FET 3, after it is inverted, with the oscillation output from the other FET 3 which remains as it is. In this way, since the oscillation outputs are combined with fundamental wave $f_0$ remaining unchanged, combiner circuit 4 generates combined output $P_o$ which has the oscillation frequency equal to fundamental wave $f_0$ and an increased amplitude.

As described above, this type of high frequency oscillator which operates as a push-push oscillator or a push-pull oscillator comprises high frequency (microwave) resonator 2; two active devices 3 for oscillation (e.g., FET); and combiner circuit 4 for performing an in-phase or an antiphase combination. FIG. 3 illustrates this configuration in block diagram form. As is apparent from this block diagram, in the conventional high frequency oscillator, high frequency resonator 2 and combiner circuit 4 are designed as completely different components. This designing policy results in a correspondingly complicated circuit configuration. With the trend of increasingly higher oscillation frequency, a more complicated design is generally required for the three components, giving rise to difficulties in reducing the size of the circuit. Combiner circuit 4 disposed in the high frequency oscillator also causes a larger increase in loss.

The aforementioned Wilkinson type combiner circuit routes lines for combining two oscillation outputs to form the combiner circuit, giving rise to a problem that a complicated design is required therefor including an oscillator circuit.

Moreover, if mutually synchronized oscillations can be realized, for example, at four phase angles, i.e., synchronized oscillations with mutual phase differences being at 0 degree, 90 degrees, 180 degrees and 270 degrees, it is possible to generate an oscillation output at a frequency four times as high as the oscillation frequency (fundamental wave $f_0$) in oscillation systems based on the principles of the push-push oscillator. However, any four-phase push-push oscillator has not been reported up to now. In other words, it is contemplated that the conventional circuit configuration can hardly be based to design this type of four-phase push-push oscillator.

SUMMARY OF THE INVENTION

It is an object of the present invention to provide a high frequency oscillator which is suitable for reducing the size and loss of the circuit and is capable of realizing, for example, even a four-phase push-push oscillator.

The object of the present invention is achieved by a high frequency oscillator which includes a transmission line resonator; a pair of active devices for oscillation connected to a pair of resonant wave points, respectively, located on the transmission line resonator in an opposite phase relationship to each other, and a combiner line connected to an electric symmetric point of the transmission line resonator. The pair of active devices constitute a pair of oscillation systems which share the transmission line resonator as a high frequency resonator, and the combiner line is configured to combine outputs from the pair of oscillation systems to generate a high frequency output.

In the present invention, the active devices for oscillation are connected, for example, to two resonant wave points located on the transmission line resonator in an opposite phase relationship to each other, so that the high frequency oscillator includes two oscillation systems which oscillate at the same oscillation frequency in opposite phase to each other. The resonant wave point is, for example, an antinode of the oscillation. In addition, since the combiner line is connected to the electric symmetric point of the transmission line resonator, the outputs of the respective oscillation systems can be combined in phase or in opposite phase. This combiner line also functions as an output line. For example, when the high frequency oscillator is designed such that the combiner line combines the outputs of the two oscillation systems in phase, the combiner line delivers double wave component $2f_0$ while canceling out fundamental wave components $f_0$ of oscillation in the respective oscillation systems. Consequently, a push-push oscillator is provided. On the other hand, when the high frequency oscillator is designed such that the combiner line combines the outputs in opposite phase, the combiner line delivers combined output $P_o$ of fundamental waves $f_0$. Thus, a push-pull oscillator is provided. In the following description, a second-order harmonic of fundamental wave $f_0$ is called the "double wave", and a fourth-order harmonic is called the "quadruple waves".

Describing in greater detail, when the active devices are connected at positions at which the transmission line resonator resonates at phases which are opposite to each other, the high frequency oscillator can induce antiphase oscillations which mutually involve phase synchronization, i.e., mutually synchronous oscillations. Any resonator having physical symmetricity always includes an electric symmetric point or an electric symmetric plane in its dipole proper wave field which is used for oscillation, so that an in-phase combination can be readily implemented only by connecting a combiner line to the electric symmetric point or plane.

This means that the high frequency oscillator need not be provided with a separate in-phase combiner circuit required for a push-push operation but can extremely simply implement an in-phase combination function. What should be taken into account in the design is only a setting of a degree of coupling between the resonator and oscillation output terminal. This is equivalent to integration of a resonator with a combiner circuit. The integration is not only significantly effective in simplification and reduction of the circuit configuration but also contributes to easy implementation of even a four-phase push-push oscillator, as later described.

Near the electric symmetric point or electric symmetric plane of a resonator, an antiphase combiner circuit can also be accomplished with the ensured electric symmetricity. Likewise, in this configuration, a so-called push-pull oscillator operation can be readily implemented even in a high frequency region such as a millimeter band without separately providing an antiphase combiner circuit.

Conventionally, a high frequency resonator is separate from a combiner circuit in configuration, whereas the high frequency resonator can be integrated with the combiner circuit only by forming or adding the combiner line to the transmission line resonator in accordance with the present invention. FIG. 4 illustrates in block diagram form the theoretical configuration of such a high frequency oscillator according to the present invention.

In the present invention, the high frequency resonator employed as the transmission line resonator is typically a microstrip line resonator. The microstrip line resonator is disposed on one principal surface of a substrate made of a dielectric material or the like, by routing a linear circuit conductor or a circular circuit conductor as a signal line in microstrip line structure. A ground conductor is deposited over the other principal surface of the substrate. Here, a resonator which has a linear circuit conductor employed for a signal line in microstrip line structure is called the "line resonator", while a resonator which has a circular circuit conductor for the signal line is called the "ring resonator".

The combiner line is typically routed to function as a transmission line on the same substrate on which the transmission line resonator is disposed. The combiner line may be a microstrip line which is connected to the microstrip line resonator through a capacitor or directly without a capacitor. Alternatively, the combiner line may be a slot line routed on the other principal surface of the substrate and electromagnetically coupled to the microstrip line resonator through the substrate.

The high frequency oscillator according to the present invention as described above can extremely readily implement a push-push oscillator which is capable of generating an oscillation output at a frequency twice as high as oscillation frequency $f_0$ in the respective oscillation systems. As appreciated, the present invention is effective in provide a higher performance but less expensive oscillator particularly for use in an ultra-high frequency band such as a millimeter band. The present invention also provides a push-pull oscillator in a quite simple configuration which is expected to generate higher power, so that the present invention is also promising particularly in the configuration of a multi-element power combination oscillator. Furthermore, the feature of the present invention which lies in the integration of the transmission line resonator with the combiner circuit also enables the origination of a four-phase push-push oscillator which has never been brought into realization.

Particularly, the enablement of the four-phase push-push oscillator means direct generation of an oscillation signal which has a frequency four times as high as a limit frequency imposed to a semiconductor device for use as an active device for oscillation. For example, if the oscillation frequency is limited to 300 GHZ due to the frequency characteristic of a semiconductor device, the four-phase push-push oscillator can generate a frequency signal at 1.2 THz which is four times as high as the limit frequency. In comparison with a frequency multiplication technique conventionally used for generating millimeter-waves, the high frequency oscillator according to the present invention can largely reduce the processing for removing unwanted waves, so that it is promising particularly as an ultra-high speed signal source appropriate to a high frequency band.

BRIEF DESCRIPTION OF TH DRAWINGS

DETAILED DESCRIPTION OF TH INVENTION

Figure 1:
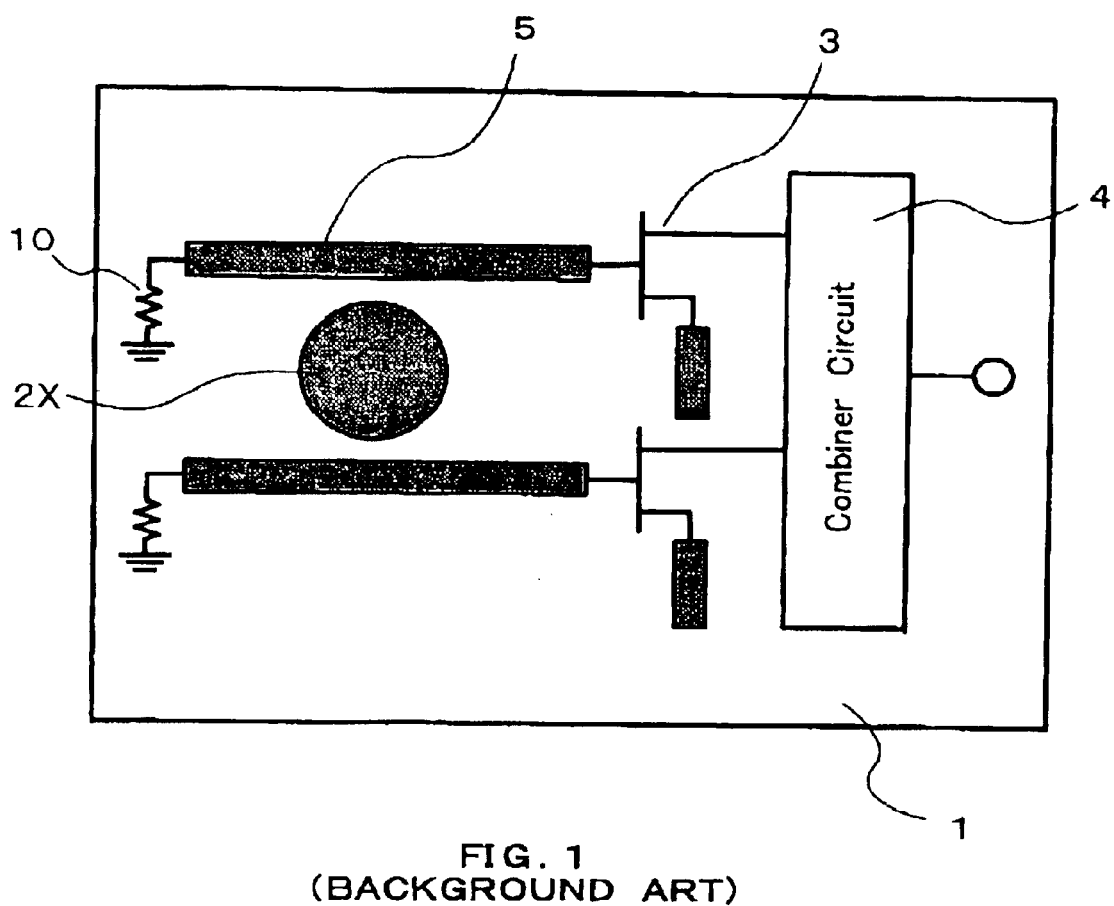
FIG. 1 is a plan view illustrating a conventional high frequency oscillator.
Figure 2A:
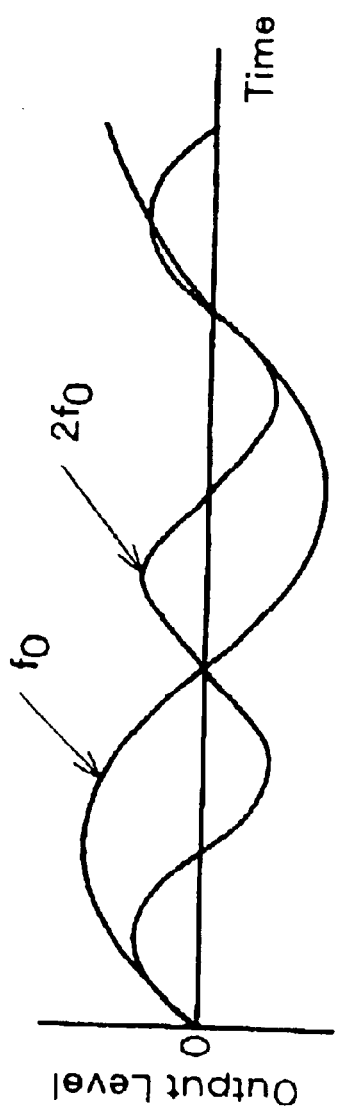
FIGS. 2A to 2C are waveform charts showing the operation of the conventional high frequency oscillator.
Figure 2B:
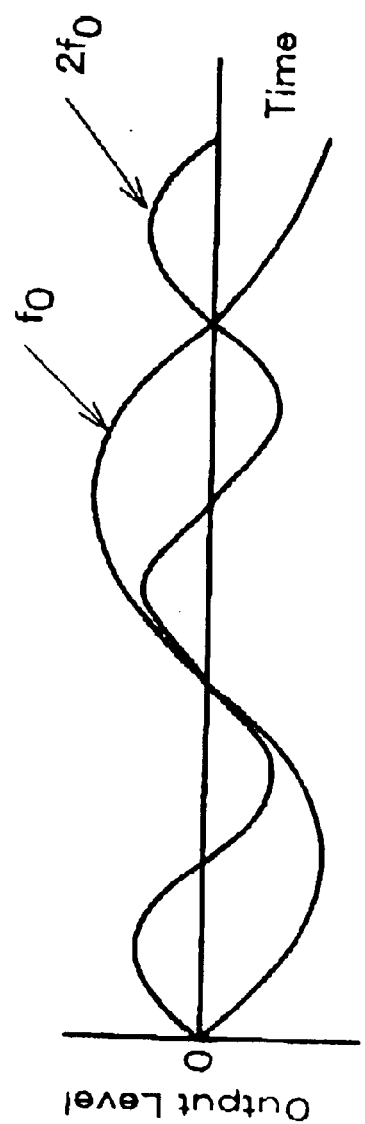
Figure 2C:
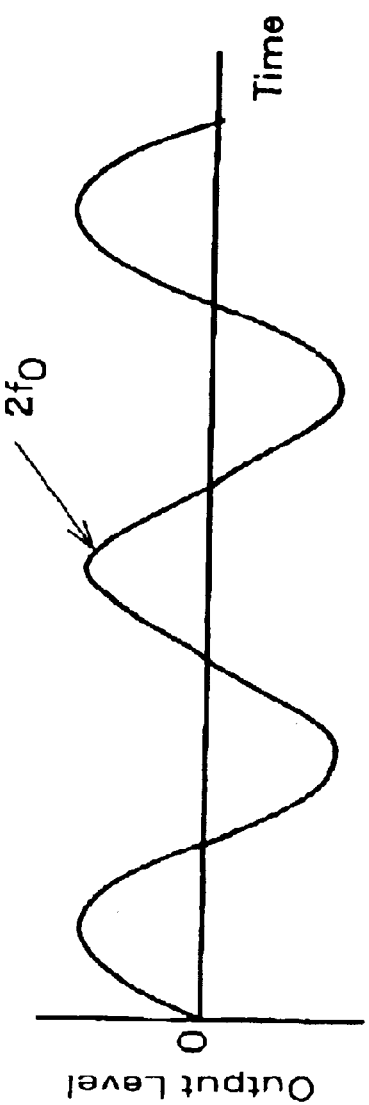
Figure 3:
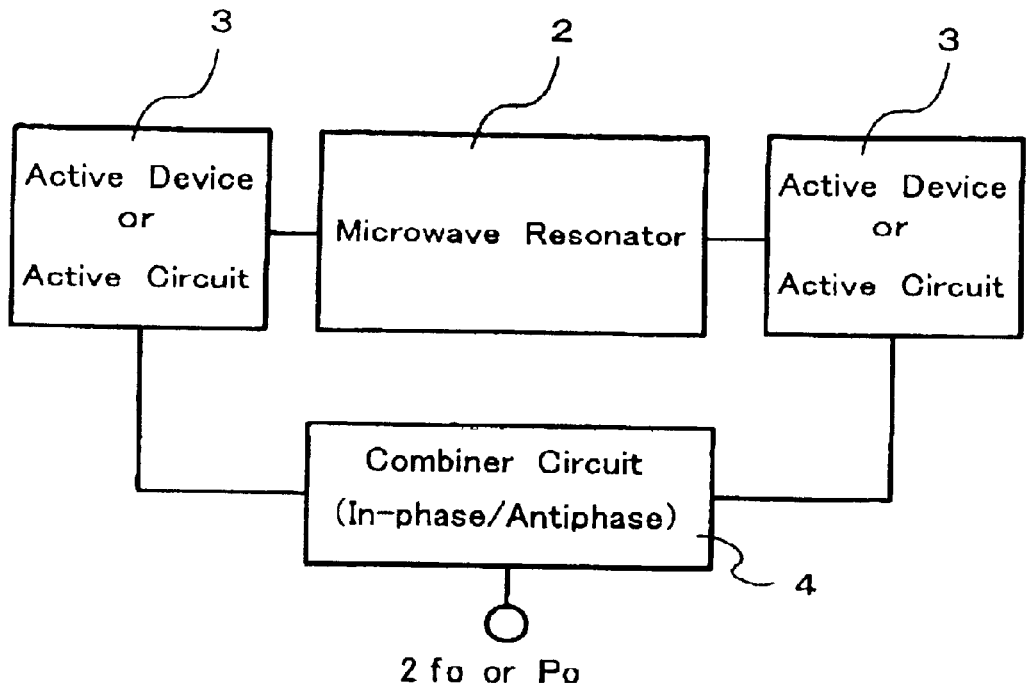
FIG. 3 is a conceptual diagram showing the operating principles of the conventional high frequency oscillator.
Figure 4:
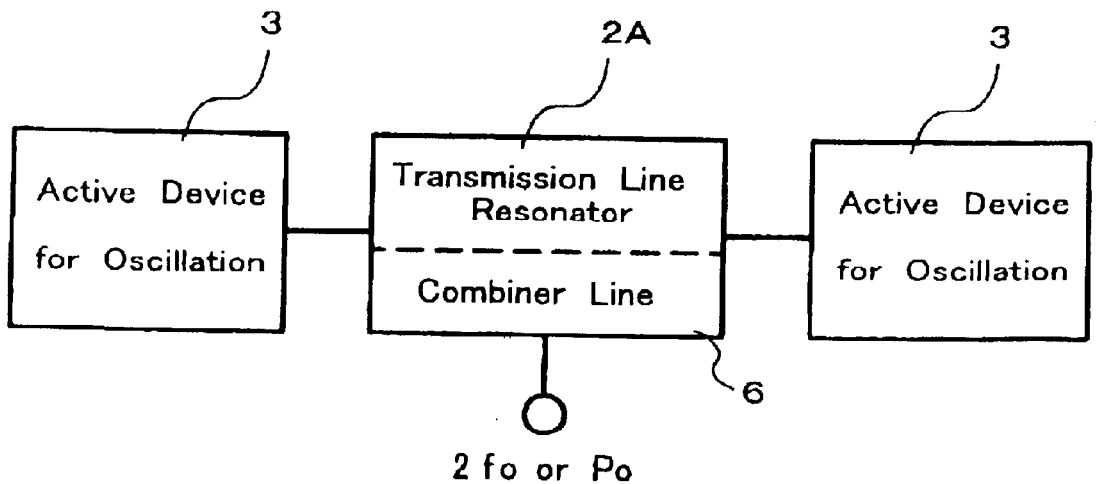
FIG. 4 is a block diagram conceptually illustrating the principles of a high frequency oscillator according to the present invention.
Figure 5A:
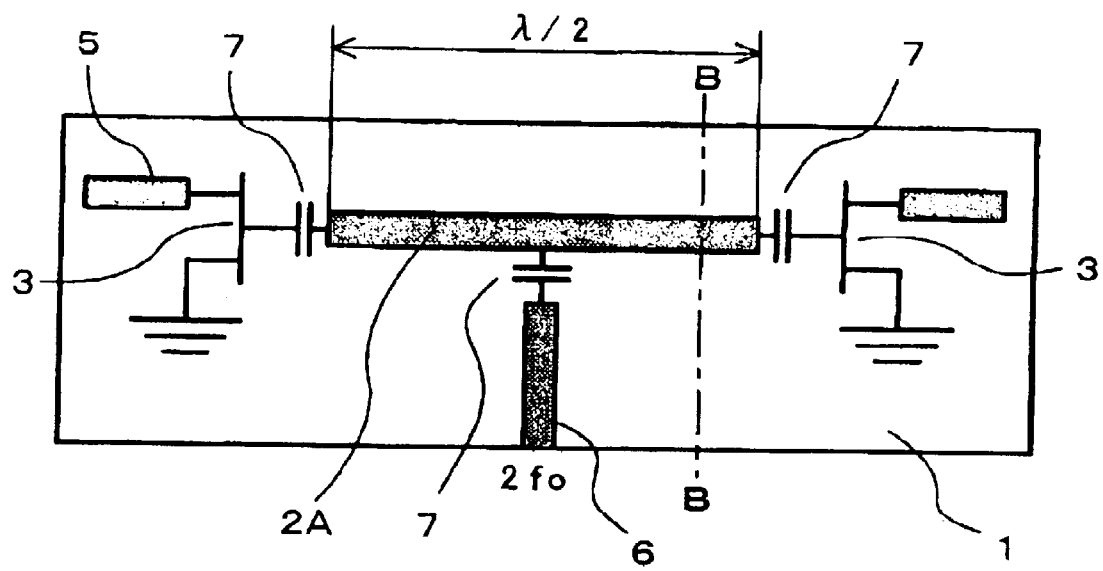
FIG. 5A is a plan view illustrating a high frequency oscillator according to a first embodiment of the present invention which is configured as a push-push oscillator.
Figure 5B:
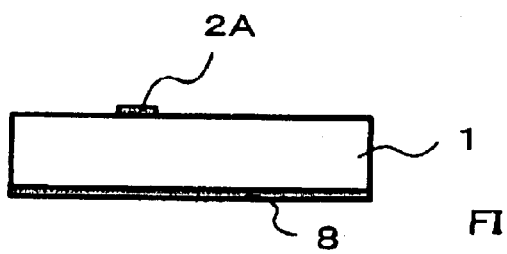
FIG. 5B is a cross-sectional view taken along a line B—B in FIG. 5A.

Referring next to FIGS. 5A and 5B, description will be made on a high frequency oscillator according to a first embodiment of the present invention. Here, the high frequency oscillator is configured as a push-push oscillator.

On one principal surface of substrate 1 made of a dielectric material, an elongated linear line having a length of $\lambda/2$ and a predetermined width is routed as a signal line, where $\lambda$ represents the wavelength corresponding to oscillation frequency (fundamental wave) $f_0$. Ground conductor 8 is formed substantially over the entirety of the other principal surface of substrate 1. The signal line, together with ground conductor 8, forms line resonator 2A having a microstrip line structure. Line resonator 2A is a transmission line resonator. In addition, two active devices 3 for oscillation and combiner line 6 having a microstrip line structure are provided on the one principal surface of substrate 1.

FETs are employed for both of two active devices 3 for oscillation. These FETs have their gates connected to both ends of the signal line, which forms part of line resonator 2A, through capacitors 7 for loose coupling. Each of FETs 3 has a grounded source, and a drain connected to microstrip line 5 designed to provide a negative resistance and supplied with an operation voltage from a power supply (not shown). Microstrip line 5 is configured to have an electrically open end, when viewed from the drains. Combiner line 6 is connected to the midpoint of the signal line of line resonator 2A, i.e., electrically symmetric point, through capacitor 7 for loose coupling.

In the configuration as described above, two active devices 3, which share line resonator 2A, form two oscillation systems, each of which has the same oscillation frequency (fundamental wave $f_0$). The respective oscillation systems oscillate in opposite phase, with their phases opposite to each other, in a principal resonant mode of line resonator 2A which has the line length of $\lambda/2$. Therefore, at the midpoint of the line resonator 2A, fundamental wave components $f_0$ of the oscillation frequencies, in opposite phase to each other, are canceled out, while in-phase second-order harmonics, i.e., double waves $2f_0$ are combined.

Since combiner line 6 is connected to the midpoint of line resonator 2A in loose coupling, the double wave component $2f_0$ combined in phase can be delivered out as it is through combiner line 6. In other words, since combiner line 6 is connected to the midpoint of line resonator 2A for performing the in-phase combination, a push-push oscillator can be implemented for canceling out fundamental wave $f_0$ and generating double wave $2f_0$.

As described above, the high frequency oscillator according to the first embodiment comprises line resonator 2A and two active devices 3 for oscillation to form two oscillation systems which are in opposite phase to each other. Then, combiner line 6 comprised of a microstrip line is loosely coupled to the midpoint of line resonator 2A to configure a push-push oscillator. Thus, an in-phase combiner circuit required for a push-push oscillator can be provided only by loosely coupling combiner line 6 to the midpoint of line resonator 2A, so that the resulting configuration is extremely simple. In this example, combiner line 6 serves, as it is, as an output line for delivering the oscillation output.

Figure 6:
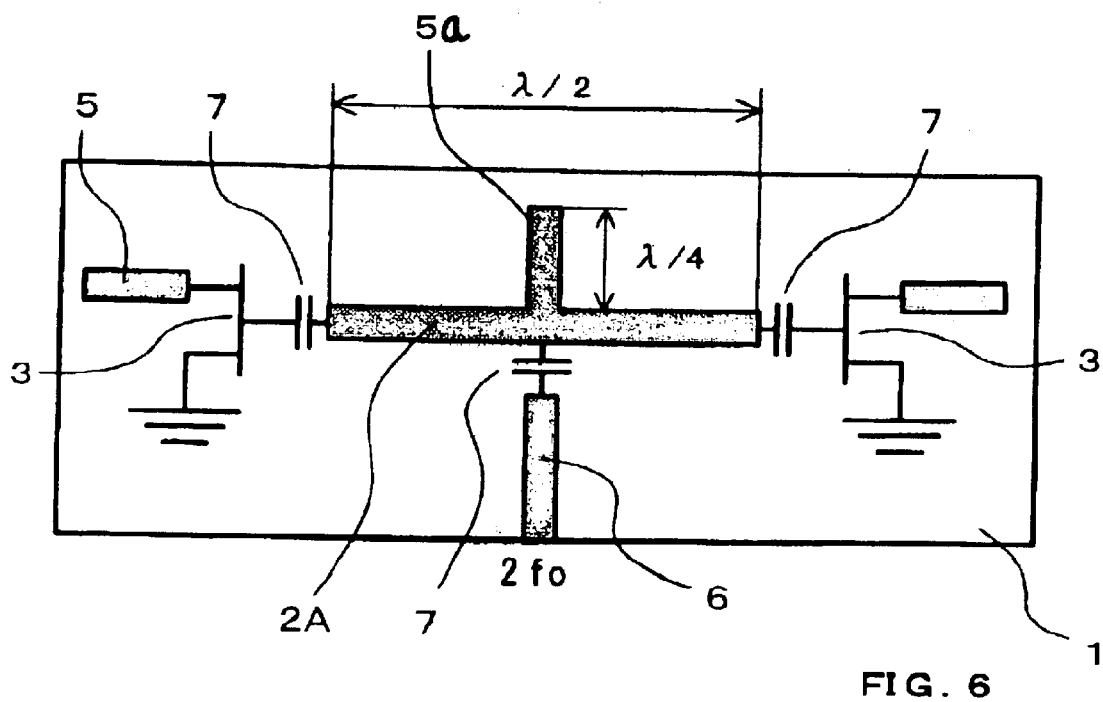
FIG. 6 is a plan view illustrating another exemplary configuration of the high frequency oscillator according to the first embodiment.

Additionally, in the first embodiment, microstrip line 5a having a line length of $\lambda/4$ with respect to the wavelength $\lambda$ of fundamental wave $f_0$ may be connected as illustrated in FIG. 6 to the midpoint of line resonator 2A to provide an electric short-circuit point, thereby permitting the high frequency oscillator to perform more stable antiphase oscillation. Specifically, microstrip line 5 causes the midpoint of line resonator 2A to be a forced zero potential point with respect to fundamental wave $f_0$. As a result, since the electric symmetric point is fixed to eliminate fluctuations in potential at the midpoint, the two oscillation systems can perform stable antiphase oscillation.

Figure 7A:
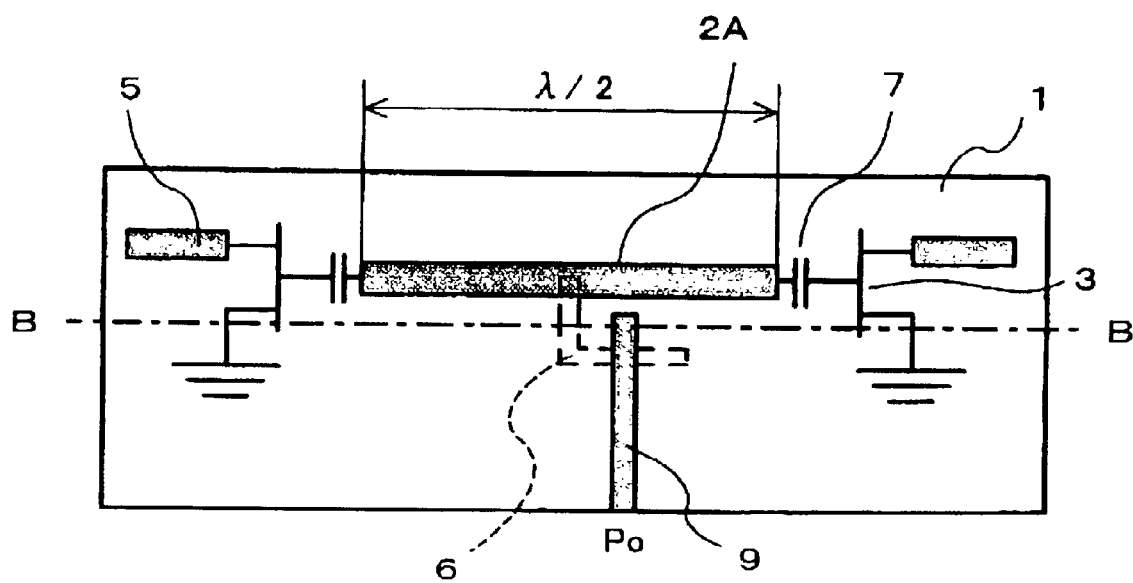
FIG. 7A is a plan view illustrating a high frequency oscillator according to a second embodiment of the present invention which is configured as a push-pull oscillator.
Figure 7B:
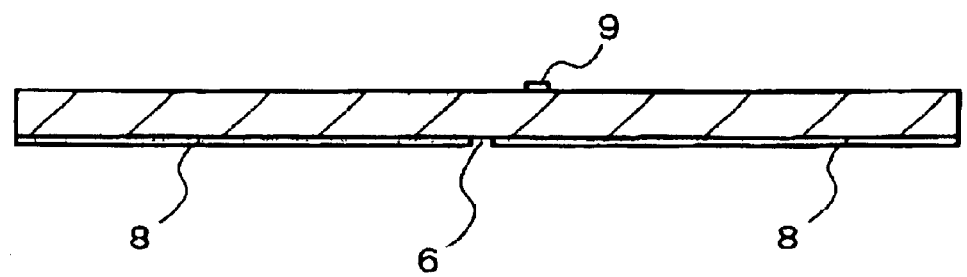
FIG. 7B is a cross-sectional view taken along a line B—B in FIG. 7A.

Referring next to FIGS. 7A and 7B, description will be made on a high frequency oscillator according to a second embodiment of the present invention. Though similar to the one illustrated in FIGS. 5A and 5B, this high frequency oscillator differs in that it is configured to be a push-pull oscillator. The high frequency oscillator according to the first embodiment has the microstrip line, serving as combiner line 6, connected to the midpoint, i.e., the electric symmetric point of line resonator 2A, both ends of which are connected to active devices 3 for antiphase oscillation to configure a push-push oscillator. On the other hand, the high frequency oscillator according to the second embodiment has a slot line, serving as combiner line 6, to the midpoint of line resonator 2A to configure a push-pull oscillator.

The slot line functioning as combiner line 6 is formed as an L-shaped opening through ground conductor 8 which is deposited over the other principal surface of substrate 1. A leading end of the slot line is positioned at the midpoint of line resonator 2A, and electromagnetically coupled to line resonator 2A. The slot line is a transmission line on which a high frequency progresses by the action of an electric field generated between conductors on both sides of the slot line, and a magnetic field generated by this electric field. Then, corresponding to a bent portion of the slot line, output line 9 is routed on the one principal surface of substrate 1 as a microstrip line which is electromagnetically coupled to the slot line. Output line 9 is drawn to an edge portion of substrate 1.

In the configuration as described above, oscillation outputs from respective active devices 3, i.e., respective oscillation systems are converted into a balanced mode of the slot line at the midpoint of line resonator 2A. In this event, near the midpoint of line resonator 2A, a high frequency voltage is minimized, while a high frequency current from each oscillation system is maximized. Therefore, a current is generated between metal conductors on both sides of the slot line by a magnetic field produced by this high frequency current, so that fundamental wave components $f_0$ can be drawn from both oscillation systems.

Specifically, on both sides of the slot line, a current at a positive peak value is induced from the output of one oscillation system, whereas a current at a negative peak value is induced from the output of the other oscillation system. Therefore, the current twice as much is induced on both sides of the slot line. From the foregoing, a combined output which propagates the slot line has a frequency equal to fundamental wave $f_0$ of the oscillation frequency and the power substantially twice the oscillation output generated by one oscillation system. Then, since output line 9 in microstrip line structure is electromagnetically coupled to the slot line which serves as combiner line 6, combined output $P_o$ is generated from the one principal surface of substrate 1 in unbalanced mode.

Similar to the first embodiment, the high frequency oscillator according to the second embodiment also forms two oscillation systems composed of line resonator 2A and two active devices 3. In addition, in the second embodiment, combiner line 6 is connected to the midpoint of line resonator 2A as a slot line for combining the outputs of the two oscillation systems in opposite phase to configure a push-pull oscillator. Thus, an antiphase combiner circuit required for a push-pull oscillator can be provided only by electromagnetically coupling the slot line at the midpoint of line resonator 2A, so that the resulting configuration is extremely simple.

Likewise, in the second embodiment, a microstrip line having a line length of $\lambda/4$ may be connected to the midpoint of line resonator 2A to permit the high frequency oscillator to perform more stable antiphase oscillation, as is the case with the circuit configuration illustrated in FIG. 6. In addition, combined output $P_o$ may be directly generated in balanced mode from combiner line 6 which is formed of a slot line routed on the other principal surface of substrate 1.

Figure 8:
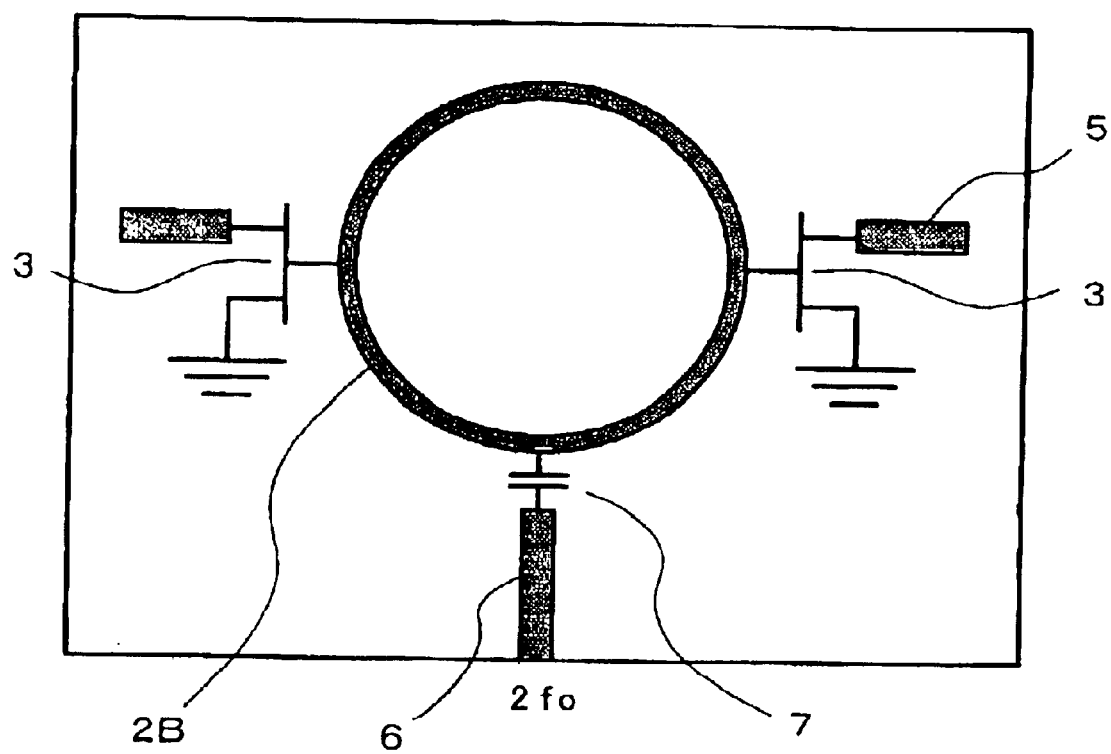
FIG. 8 is a plan view illustrating a high frequency oscillator according to a third embodiment of the present invention which is configured as a push-push oscillator.

Referring next to FIG. 8, description will be made on a high frequency oscillator according to a third embodiment of the present invention. This high frequency oscillator is a push-push oscillator similar to that illustrated in FIGS. 5A and 5B, but differs in that ring resonator 2B is used for a transmission line resonator.

The high frequency oscillator according to the third embodiment comprises ring resonator 2B; two active devices 3; and combiner line 6. A signal line is circularly routed on one principal surface of substrate 1 made of a dielectric material or the like. This signal line forms ring resonator 2B in microstrip line structure, together with a ground conductor deposited substantially over the entirety of the other principal surface of substrate 1. The circular signal line of ring resonator 2B has a line length $\lambda$, where $\lambda$ represents the wavelength corresponding to an oscillation frequency (i.e. fundamental wave $f_0$).

FETs are employed for two active devices 3. Locations symmetric to the center of ring resonator 2B, left and right side ends in the illustrated signal line, are defined as resonant wave points (antiphase points). The FETs have their gates directly connected to the resonant wave points, respectively, to form two oscillation systems which share ring resonator 2B. Then, combiner line 6 in microstrip line structure is connected at one of the midpoints of the two resonant wave points on ring resonator 2B through capacitor 7 for loose coupling.

In the configuration described above, active devices 3 are connected to both left and right side ends, i.e., resonant wave points of ring resonator 2B which has the line length equal to one wavelength for oscillation, the respective oscillation systems oscillate in opposite phase to each other in a fundamental oscillation mode of ring resonator 2B. Then, combiner line 6 is connected, for example, to a lower end, which is located at the midpoint of the left and right side ends of ring resonator 2B, so that double wave $2f_0$ is delivered through combiner line 6, while canceling out fundamental waves $f_0$ in opposite phase to each other, as is the case with the first embodiment.

As appreciated, in the third embodiment, an in-phase combiner circuit required for a push-push oscillator can be provided only by loosely coupling combiner line 6 to the lower end of ring resonator 2B, thereby generating double wave $2f_0$ of the oscillation frequency (fundamental wave $f_0$) in an extremely simple configuration.

Figure 9:
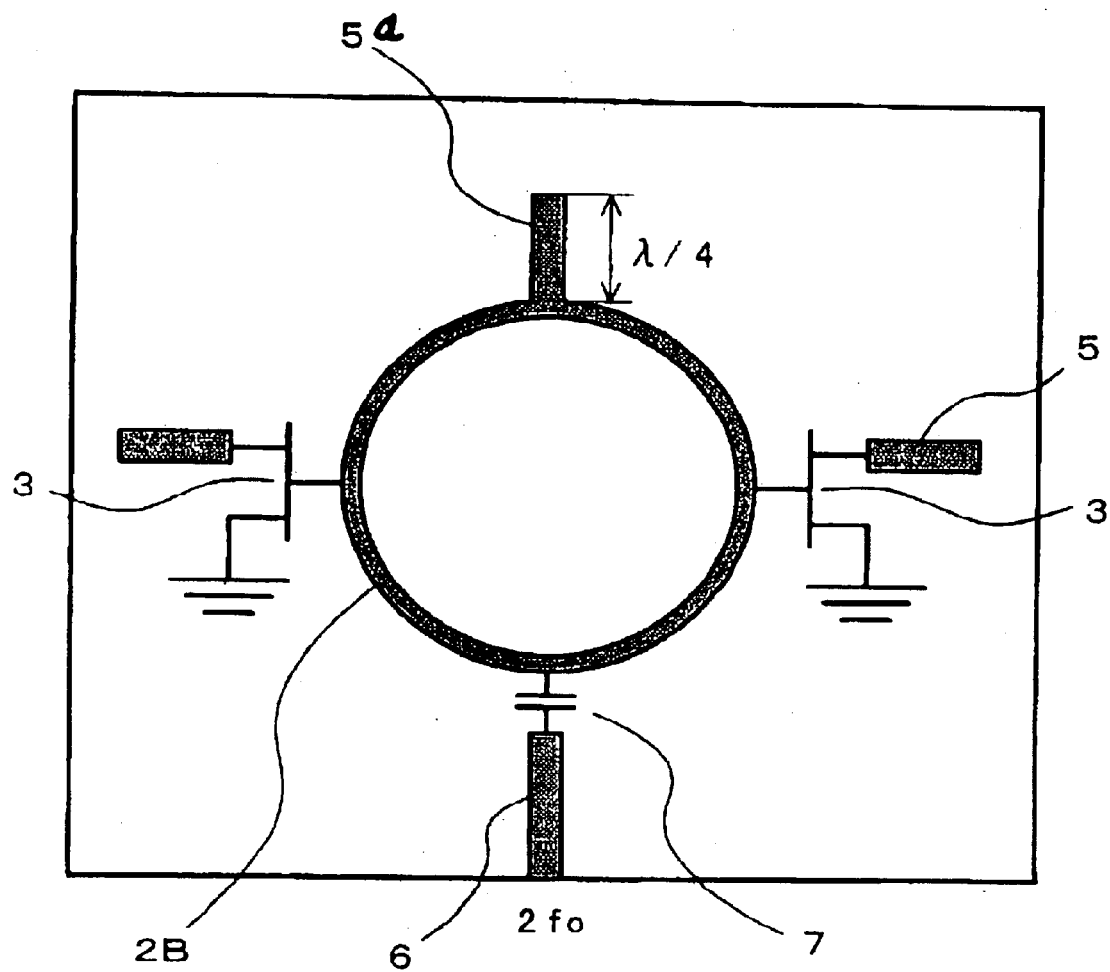
FIG. 9 is a plan view illustrating another exemplary configuration of the high frequency oscillator according to the third embodiment.

It should be noted that in the third embodiment, the resonant wave points are located at the left and right side ends of ring resonator 2B, so that two midpoints, i.e., electric symmetric points exist between the resonant wave points, at an upper and a lower positions of illustrated ring resonator 2B. In the foregoing embodiment, combiner line 6 is connected to the lower midpoint as illustrated for in-phase combination. Alternatively, as illustrated in FIG. 9, microstrip line 5a having a line length of $\lambda/4$ with respect to the wavelength $\lambda$ of fundamental wave $f_0$ may be connected to the upper midpoint of the illustrated ring oscillator. This microstrip line 5a functions as an electric short-circuit end for fundamental wave component $f_0$, so that the upper midpoint serves as a zero-potential point (reference point) for fundamental wave component $f_0$ to excite antiphase oscillation, resulting in stable antiphase oscillation, as described above.

Figure 10:
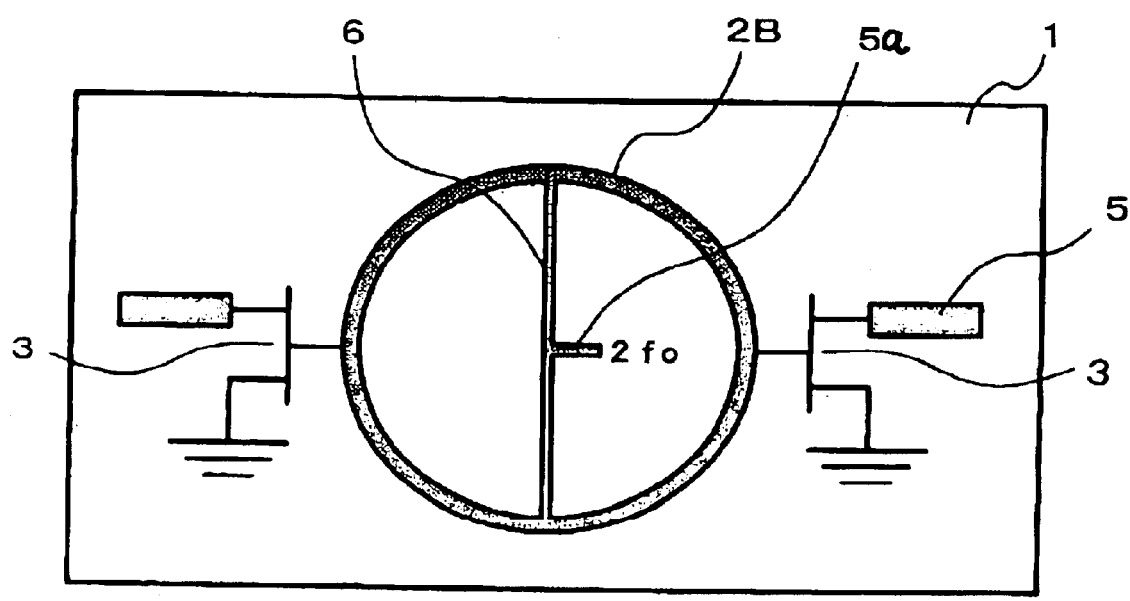
FIG. 10 is a plan view illustrating a further exemplary configuration of the high frequency oscillator according to the third embodiment.

Further, as illustrated in FIG. 10, the upper and lower ends of ring resonator 2B, i.e., the midpoints of resonant wave points (at the left and right side ends) may be linearly connected to each other by combiner line 6 formed of a microstrip line to generate in-phase combined double wave $2f_0$ from the midpoint of combiner line 6. In this event, the point symmetricity is substantially maintained with respect to the center of ring resonator 2B, resulting in a good resonant characteristic and a higher stability of the oscillation frequency, without disturbing an electromagnetic wave field.

Figure 11A:
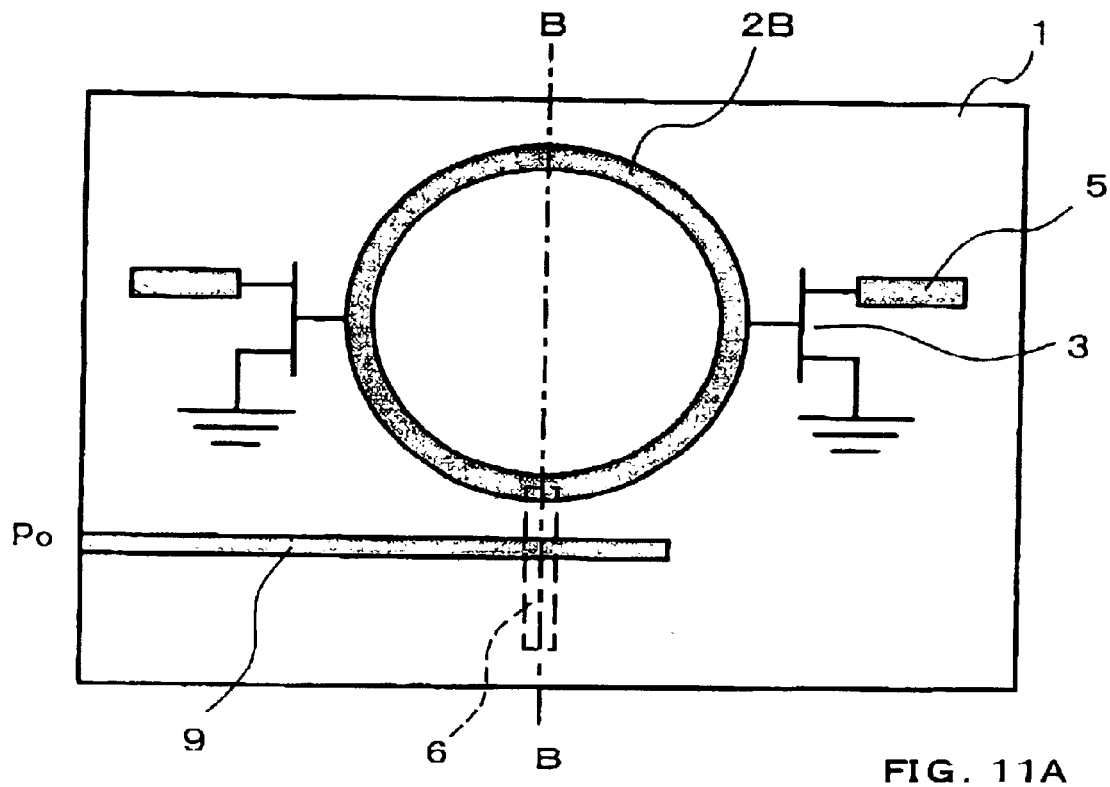
FIG. 11A is a plan view illustrating a high frequency oscillator according to a fourth embodiment of the present invention which is configured as a push-pull oscillator.
Figure 11B:
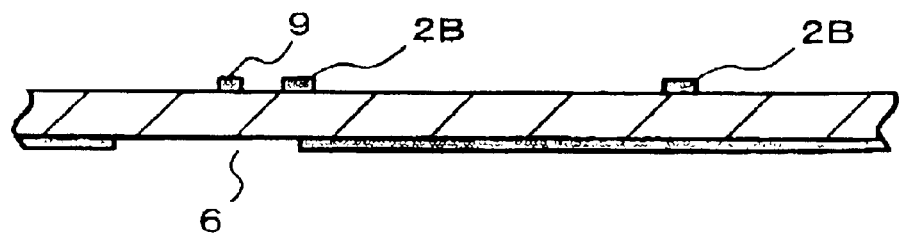
FIG. 11B is a cross-sectional view taken along a line B—B in FIG. 11A.

Referring next to FIGS. 11A and 11B, description will be made on a high frequency resonator according to a fourth embodiment of the present invention. This high frequency oscillator is similar to that illustrated in FIG. 8, but differs in that it is configured to be a push-pull oscillator. In the fourth embodiment, a slot line is connected as combiner line 6 at a lower end of ring resonator 2B for antiphase oscillation, which is the midpoint of resonant wave points at a left and a right side end of ring resonator 2B. Then, output line 9 is formed to intersect the slot line. The slot line is formed as a strip-shaped opening through ground conductor 8 which is deposited over the other principal surface of substrate 1, in such a manner that its leading end is positioned just beneath the signal line of ring resonator 2B. Output line 9, which has a microstrip line structure, is routed on the one principal surface of substrate 1, and electromagnetically coupled to combiner line 6 comprised of the slot line through substrate 1.

In the configuration as described above, at the lower end of ring resonator 2B which is the midpoint of the resonant wave points, a doubled current is induced, as described in the second embodiment, by a magnetic field produced by high frequency currents in opposite phase to each other on both end sides of combiner line 6 comprised of the slot line. Thus, combiner line 6 generates combined output $P_o$ of fundamental wave components $f_0$, which has the power approximately twice the output which is generated when the high frequency oscillator has a single oscillation system. In this event, combined output Po is generated in unbalanced mode by output line 9 comprised of the microstrip line.

Figure 12A:
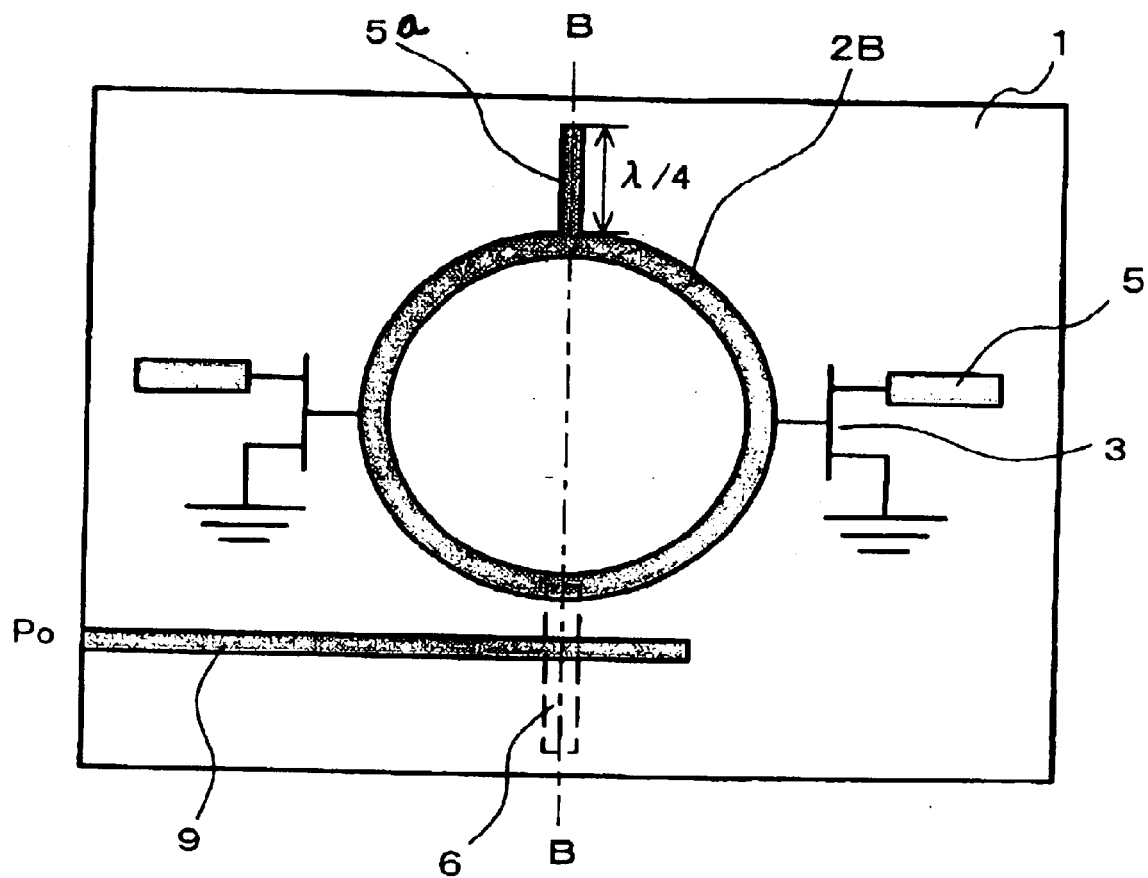
FIG. 12A is a plan view illustrating another exemplary configuration of the high frequency oscillator according to the fourth embodiment.
Figure 12B:
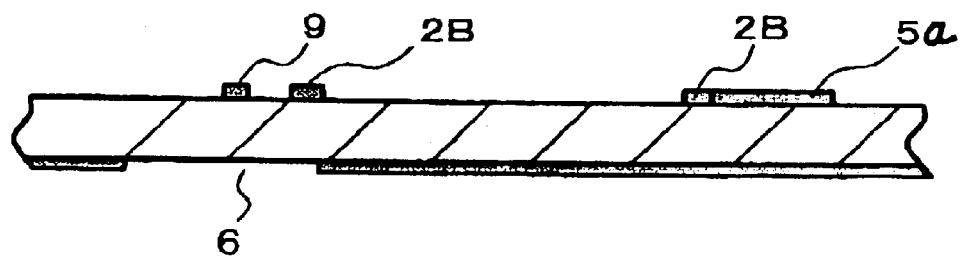
FIG. 12B is a cross-sectional view taken along a line B—B in FIG. 12A.
Figure 13:
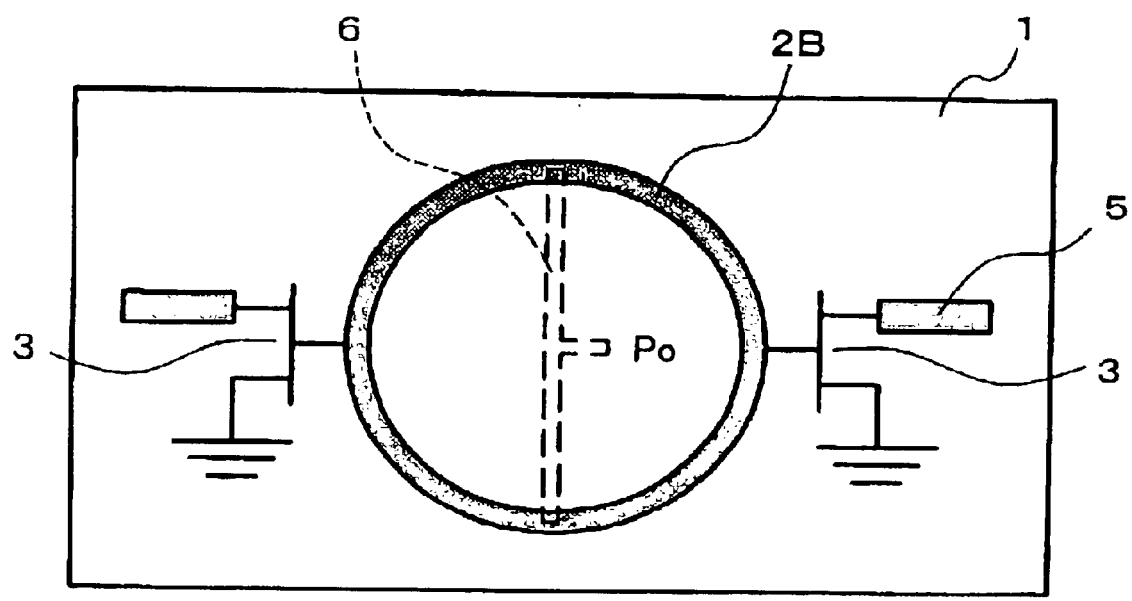
FIG. 13 is a plan view illustrating a further exemplary configuration of the high frequency oscillator according to the fourth embodiment.

As is the case with the third embodiment, microstrip line 5a having a line length of $\lambda/4$ may be routed for connection to an upper end of ring resonator 2B in the fourth embodiment, as illustrated in FIGS. 12A and 12B, thereby permitting the high frequency oscillator to provide better antiphase oscillation. Alternatively, as illustrated in FIG. 13, the upper and lower ends of ring resonator 2B may be connected to each other by combiner line 6 comprised of a slot line to deliver combined output $P_o$ from the midpoint of the slot line.

Figure 14:
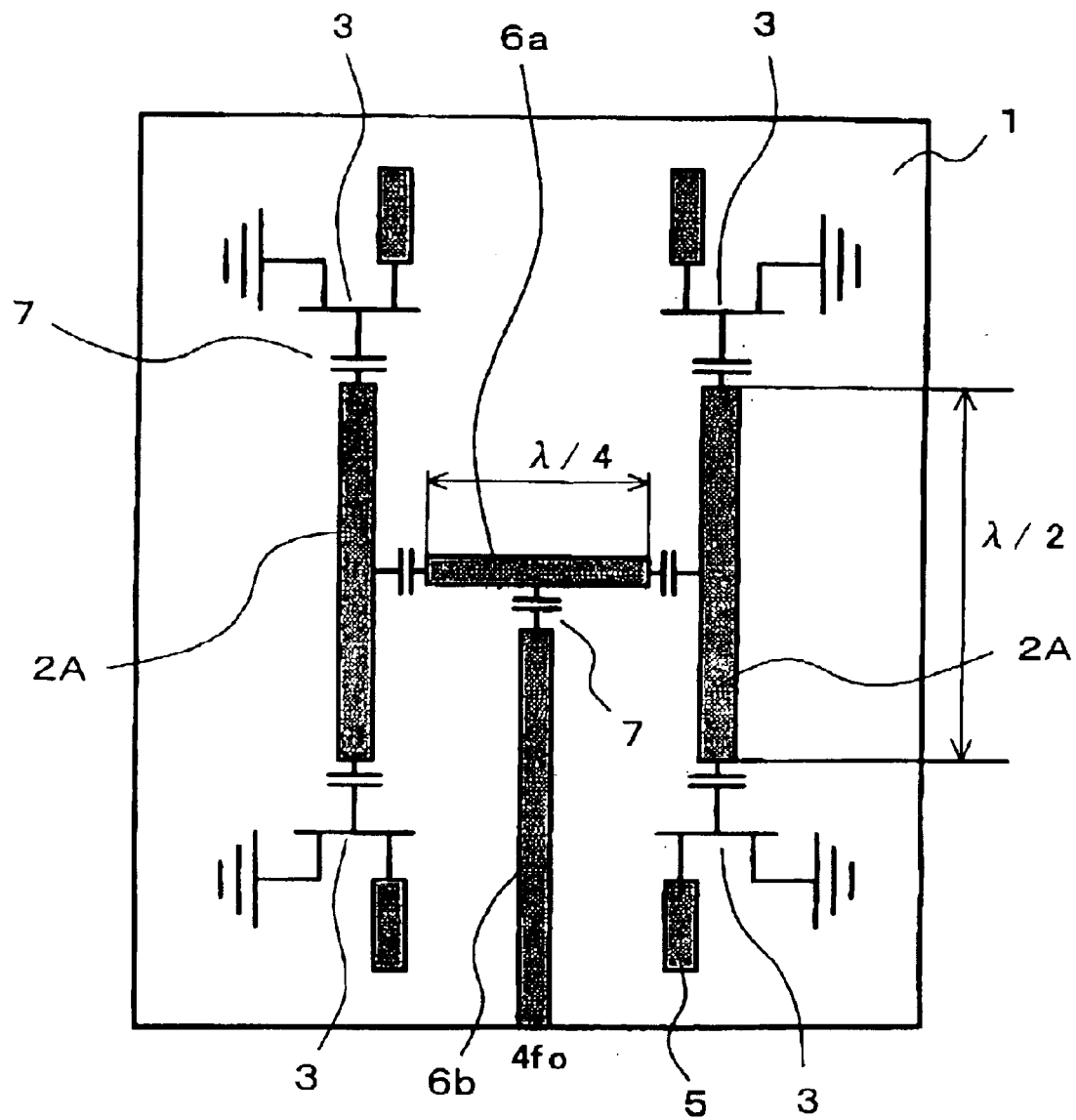
FIG. 14 is a plan view illustrating a high frequency oscillator according to a fifth embodiment of the present invention which is configured as a push-push oscillator for generating a quadruple wave.

Referring next to FIG. 14, description will be made on a high frequency oscillator according to a fifth embodiment of the present invention. Here, the high frequency oscillator is designed to generate an oscillation output having a frequency four times as high as oscillation frequency (fundamental wave) $f_0$, i.e., quadruple wave $4f_0$.

In the high frequency oscillator according to the fifth embodiment, two push-push oscillators according to the first embodiment are disposed on one principal surface of substrate 1 such that line resonators 2A are in parallel with each other. Then, the midpoints of line resonators 2A of the respective push-push oscillators are connected to each other through first combiner line 6a. First combiner line 6a, which has a microstrip line structure, has both ends connected to the midpoints of line resonators 2A, respectively, through capacitors 7 for loose coupling. Each of line resonators 2A has a length of $\lambda/2$, while first combiner line 6a has a length of $\lambda/4$, where $\lambda$ represents the wavelength at the oscillation frequency (fundamental wave $f_0$). Further, in this high frequency oscillator, second combiner line 6b having a microstrip line structure is connected to the midpoint of first combiner line 6a through capacitor 7 for loose coupling. As is the case with the other embodiments, a ground conductor is deposited substantially over the entirety of the other main surface of substrate 1.

In the configuration as described above, the outputs of respective push-push oscillators respectively having line resonators 2A are combined in opposite phase by first combiner line 6a. As a result, each push-push oscillator supplies first combiner line 6a with even-numbered order harmonics of fundamental wave $f_0$. As mentioned above, first combiner line 6a has a line length of $\lambda/4$ which is one-half wavelength with respect to double wave $2f_0$. In this regard, when viewed from first combiner line 6a, the push-push oscillators connected at both ends thereof are regarded as active devices or active circuits, and first combiner line 6a functions as a line resonator for frequency $2f_0$. Thus, second combiner line 6b connected to the midpoint of first combiner line 6a combines double wave components $2f_0$ in opposite phase, so that second combiner line 6b provides quadruple wave $4f_0$ which has a frequency four times as high as fundamental wave $f_0$.

Stated another way, while oscillation outputs are combined in opposite phase to each other to conduct two phase combination at 0 degree (360 degrees) and 180 degrees in the aforementioned first to fourth embodiments, the high frequency oscillator according to the fifth embodiment is designed to combine oscillation outputs at four phases additionally including 90 degrees between 0 degree and 180 degrees, and 270 degrees between 180 degrees and 360 degrees. Consequently, this is equivalent to the combination of oscillation frequencies (fundamental waves $f_0$) by first combiner line 6a and second combiner line 6b with a phase difference of 90 degrees from each other. In this way, quadruple wave $4f_0$ is generated in a simple configuration. This is a circuit configuration solely provided by the present invention which integrates a resonator and a combiner circuit.

Figure 15:
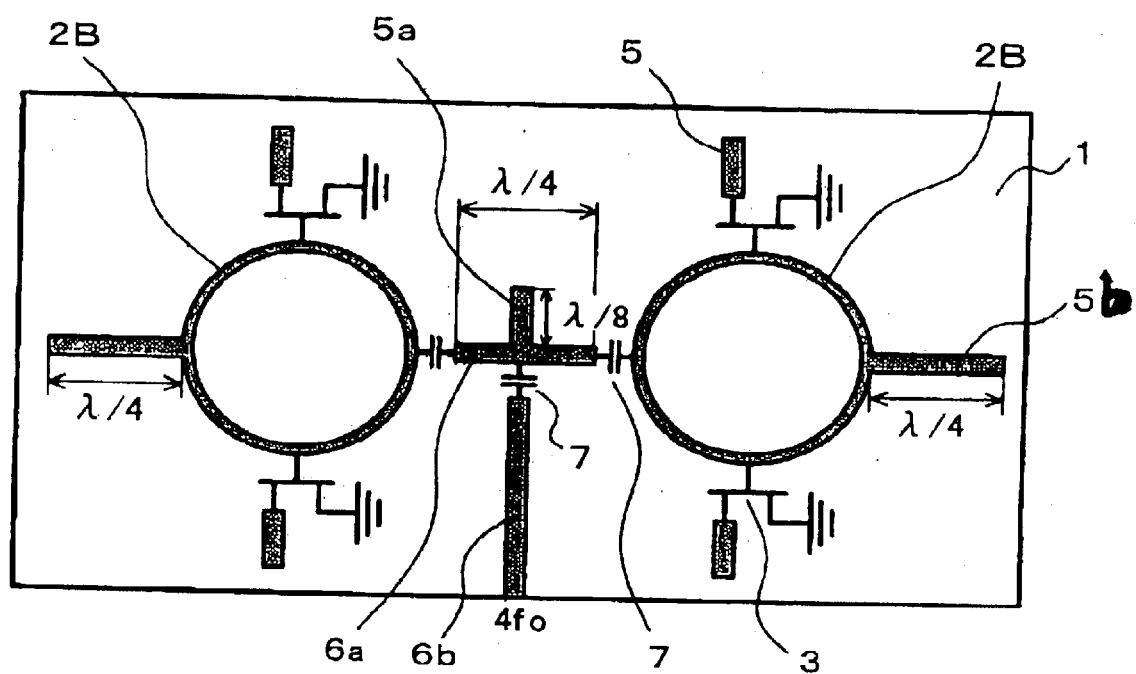
FIG. 15 is a plan view illustrating a high frequency oscillator according to a sixth embodiment of the present invention.

Referring next to FIG. 15, description will be made on a high frequency oscillator according to a sixth embodiment of the present invention. While the fifth embodiment has shown the configuration based on the line resonators to generate quadruple wave $4f_0$ at the frequency four times as high as fundamental wave $f_0$, the sixth embodiment employs a ring resonator to generate quadruple wave $4f_0$.

The high frequency oscillator according to the sixth embodiment has, for example, the push-push resonators, arranged in parallel, each of which comprises ring resonator 2B, described with reference to FIG. 9. The combiner lines of the push-push oscillators illustrated in FIG. 9 are connected to each other to form first combiner line 6a. First combiner line 6a has a line length of $\lambda/4$, where $\lambda$ represents the wavelength corresponding to fundamental wave $f_0$. Second combiner line 6b having a microstrip line structure is connected to the midpoint of first combiner line 6a through capacitor 7 for loose coupling. Also, microstrip line 5a having a line length of $\lambda/8$ is connected to the midpoint of first combiner line 6a. This microstrip line 5a having the length of $\lambda/8$ functions as an electric short-circuit end for double wave $2f_0$.

In the configuration as described above, antiphase combination points of the respective high frequency oscillators, i.e., the midpoints of ring resonators 2B at which double waves $2f_0$ are combined, are connected to each other through first combiner line 6a which has a wavelength equal to one-half waveform with respect to double wave $2f_0$. Therefore, at the midpoint of first combiner line 6a, double waves $2f_0$ are canceled out, while the oscillation frequencies (fundamental waves $f_0$) are combined into a component having a frequency twice as high as double wave $2f_0$, i.e., quadruple waves $4f_0$. Consequently, the quadruple wave can be delivered from second combiner line 6b. Likewise, in this event, fundamental waves $f_0$ are combined at four phase angles, i.e., 0 degree, 90 degrees, 180 degrees, and 270 degrees.

Figure 16:
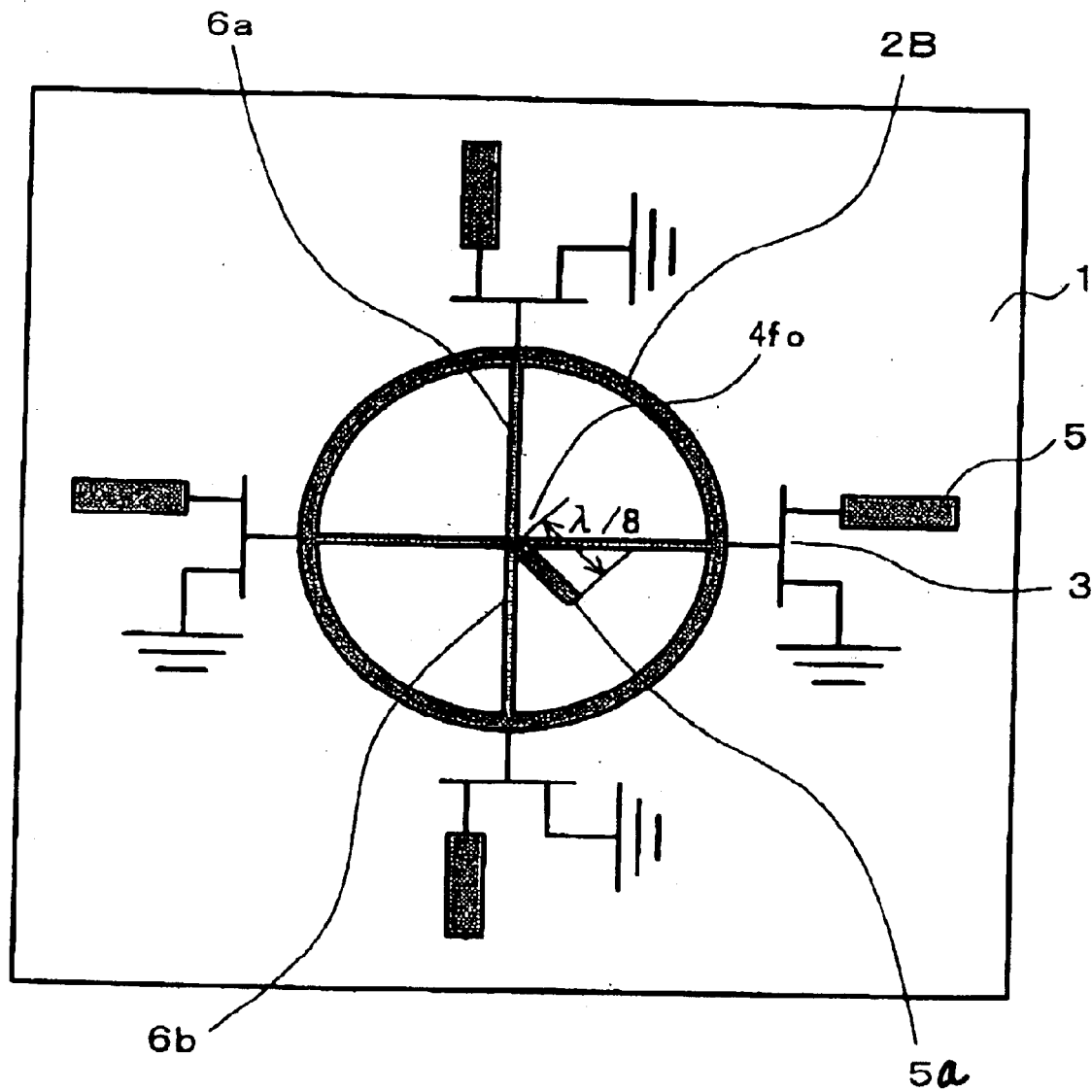
FIG. 16 is a plan view illustrating another exemplary configuration of the high frequency oscillator according to the sixth embodiment.

While the high frequency oscillator illustrated in FIG. 15 arranges two push-push oscillators using ring resonators 2B to generate the quadruple wave, the high frequency oscillator may be modified in the following manner. As illustrated in FIG. 16, active devices 3 for oscillation are connected respectively at four points at which ring resonator 2B having a line length of $\lambda$ is equally divided into four, i.e., every 90 degrees viewed from the center. In the illustrated high frequency oscillator, active devices 3 are connected at upper, lower, left and right points of ring resonator 2B. Then, two sets of opposing connection points, at which active devices 3 are connected, are commonly connected through first and second combiner lines 6a, 6b in microstrip line structure which have a smaller line width than signal lines of ring oscillators 2B for loose coupling.

First and second combiner lines 6a, 6b have an intersection at the center of ring resonator 2B, to which connected is microstrip line 5a having a length of $\lambda/8$. Likewise, in this configuration, double waves $2f_0$ are canceled out, while a quadruple wave at a frequency four times as high as fundamental wave $f_0$ is combined at the intersection of first and second combiner lines 6a, 6b, thereby accomplishing four-phase combination. Quadruple wave $4f_0$ can be taken to the outside, for example, through a coaxial line which is drawn to the back side of substrate 1 through substrate 1 from the intersection of first and second combiner lines 6a, 6b.

While the high frequency oscillators according to the fifth and sixth embodiments described above are both implemented as push-push oscillators, they may be configured to be push-pull oscillators.

Figure 17:
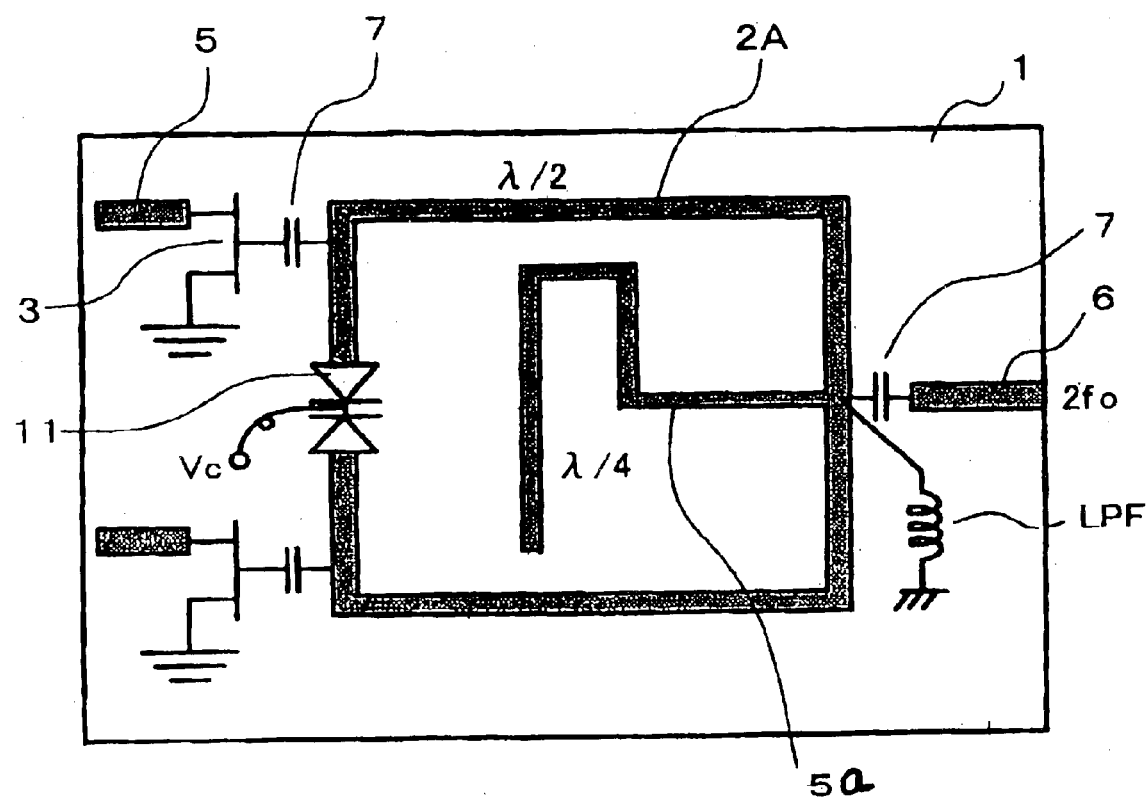
FIG. 17 is a plan view illustrating a high frequency oscillator according to a seventh embodiment of the present invention.

Referring next to FIG. 17, description will be made on a high frequency oscillator according to a seventh embodiment of the present invention. The high frequency oscillator according to the seventh embodiment is a modification to the high frequency oscillator using a line resonator illustrated in the first embodiment and the like to configure a variable-frequency type high frequency oscillator. The seventh embodiment shows a push-push oscillator.

Line resonator 2A is disposed on one principal surface of substrate 1. Like the foregoing embodiments, a ground conductor is deposited substantially over the entirety of the other principal surface of substrate 1. Line resonator 2A is formed in a strip shape and has a line length of $\lambda/2$. Specifically, line resonator 2A is bent such that both ends of the line resonator of the push-push oscillator illustrated in FIG. 6 are located adjacent to each other. Combiner line 6 is connected to the midpoint of line resonator 2A through capacitor 7 for loose coupling. Microstrip line 5a having a length of $\lambda/4$ is connected to the midpoint of line resonator 2A, in a manner similar to that illustrated in FIG. 6, for providing an electric short-circuit end with respect to fundamental wave $f_0$.

Active devices 3 for oscillation are connected at both ends of line resonator 2A, respectively, through capacitors 7 for loose coupling. Voltage variable capacitive elements 11 have their anodes connected to both ends of line resonator 2A, respectively. These voltage variable capacitive elements 11 have their cathodes connected in common, and a lead wire is connected to the common connection for applying control voltage Vc. The midpoint of line resonator 2A is further connected to a ground point through low pass filter LPF for filtering out high frequency components and passing DC components therethrough.

In the configuration as described above, control voltage Vc is applied to voltage variable capacitive elements 11 to vary the capacitances of voltage variable capacitive elements 11, causing a change in the electric line length of line resonator 2A and a resulting change in the oscillation frequency (fundamental wave $f_0$) in each oscillation system. In this event, when the capacitances of voltage variable capacitive elements 11 are chosen to be relatively small to increase the reactance viewed from line resonator 2A, the respective oscillation systems oscillate in opposite phase with respect to fundamental wave $f_0$. It is therefore possible to control the frequency of double wave $2f_0$ combined at the midpoint of line resonator 2A by changing control voltage Vc.

Figure 18:
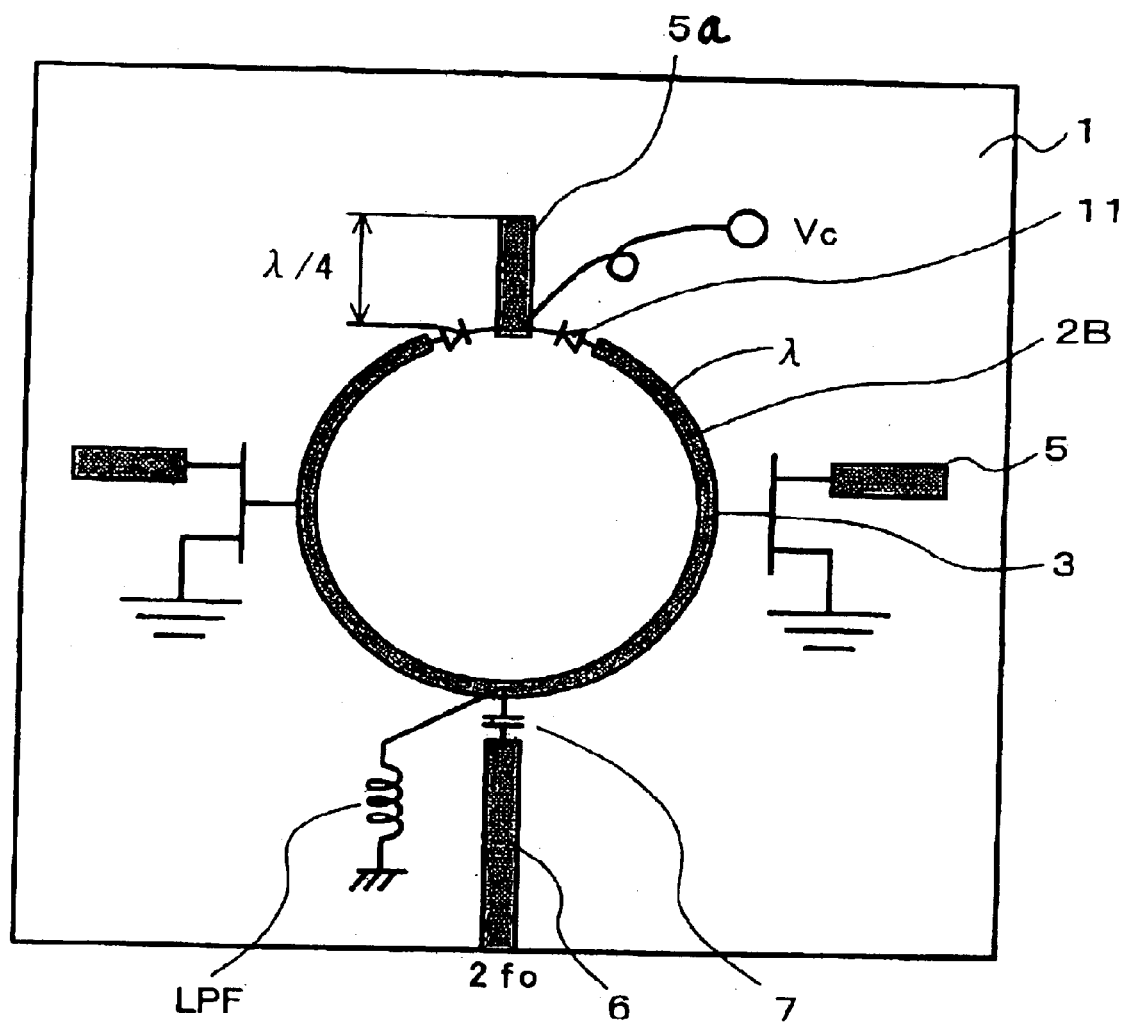
FIG. 18 is a plan view illustrating a high frequency oscillator according to an eighth embodiment of the present invention.

Referring next to FIG. 18, description will be made on a high frequency oscillator according to an eighth embodiment of the present invention. The high frequency oscillator according to the eighth embodiment is a modification to the high frequency oscillator using a line resonator illustrated in the third embodiment to configure a variable-frequency type high frequency oscillator. The eighth embodiment shows a push-push oscillator.

The high frequency oscillator according to the eighth embodiment is constructed by adding, to the high frequency oscillator illustrated in FIG. 9, an opening, for example, in an upper portion of ring resonator 2A; and voltage variable capacitive elements 11 disposed respectively between both ends of the opening and microstrip line 5a which has a line length of $\lambda/4$. Voltage variable capacitive elements 11 have cathodes commonly connected to microstrip line 5a and anodes connected to the signal lines on both sides of the opening, respectively. Then, a connection point of the cathodes is applied with control voltage Vc. An electric symmetric point at a lower end of ring resonator 2B is connected to ground through low pass filter LPF.

In the configuration as described above, since control voltage Vc applied to voltage variable capacitive elements 11 causes a change in the electric line length of ring resonator 2B to change the oscillation frequencies (fundamental waves $f_0$) of the respective oscillation systems, the frequency of double wave $2f_0$ combined at the lower end of ring resonator 2B also changes in response to control voltage Vc.

Figure 19:
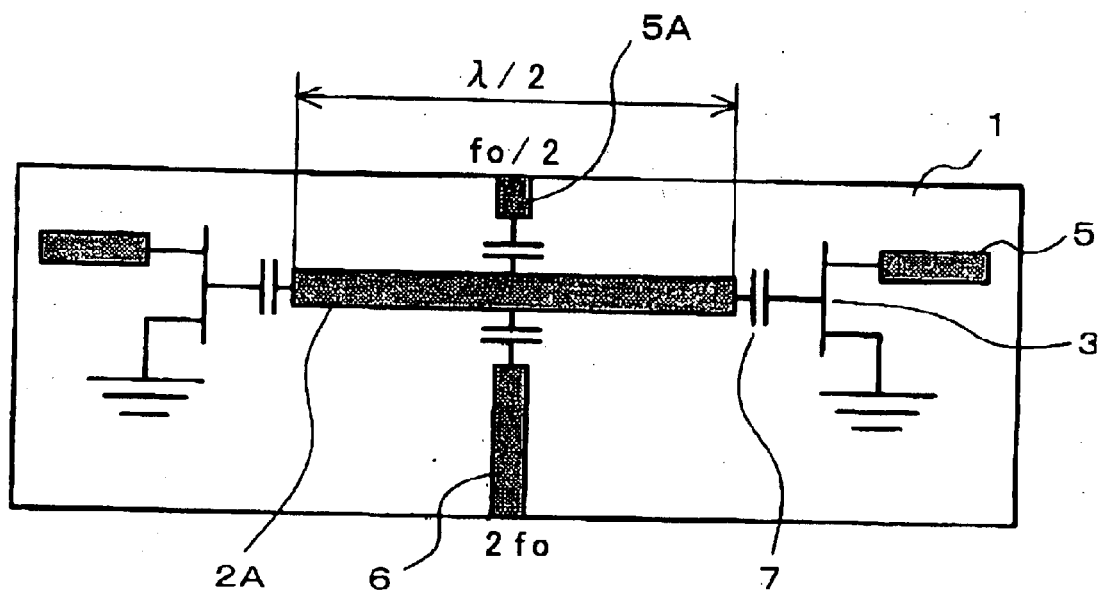
FIG. 19 is a plan view illustrating a high frequency oscillator according to a ninth embodiment of the present invention.

Referring next to FIG. 19, description will be made on a high frequency oscillator according to a ninth embodiment of the present invention. The high frequency oscillator according to the ninth embodiment applies injection-locking to the high frequency oscillators in the foregoing respective embodiments.

The high frequency oscillator illustrated in FIG. 19 additionally includes microstrip line 5A connected to the midpoint of line resonator 2A through capacitor 7 for loose coupling in the high frequency oscillator illustrated in FIG. 5A. Then, a synchronizing signal, for example, at a frequency half as high as fundamental wave $f_0$ is injected through microstrip line 5A. In this way, the oscillation frequencies (fundamental waves) of the respective oscillation systems are matched in phase every $2\lambda$ by the synchronizing signal, thereby improving the frequency stability of double wave $2f_0$, which is the oscillation output, as well as the phase noise characteristic.

Figure 20:
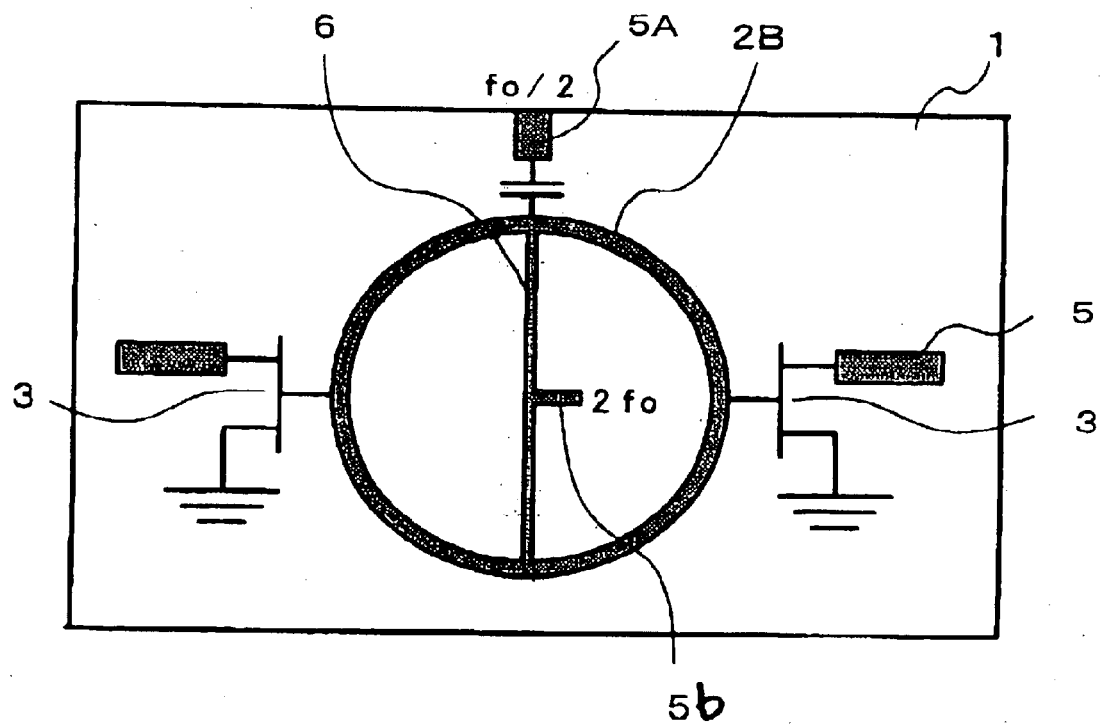
FIG. 20 is a plan view illustrating another exemplary configuration of the high frequency oscillator according to the ninth embodiment.

A high frequency oscillator illustrated in FIG. 20 additionally includes microstrip line 5A connected to the upper end of ring resonator 2B through capacitor 7 for loose coupling in the high frequency oscillator illustrated in FIG. 10. Then, a synchronizing signal, for example, at a frequency half as high as fundamental wave $f_0$ is injected through microstrip line 5A. Similar to the high frequency oscillator illustrated in FIG. 19, the injected synchronizing signal improves the frequency stability of double wave $2f_0$ and the phase noise characteristic. Further, in a high frequency oscillator which has a microstrip line connected at the upper end of ring resonator 2B for functioning as an electric short-circuit end for the fundamental wave, another microstrip line may be connected in loose coupling to inject the synchronization signal.

While preferred embodiments of the present invention have been described above, the present invention is not limited to the foregoing embodiments.

While the foregoing embodiments employ FETs as active devices 3 for oscillation, a bipolar transistor, a negative resistance diode, a negative resistance IC, and the like, for example, may be used for the active device, instead of FET. In addition, while a capacitor is used for achieving the loose coupling between transmission lines, a gap capacitor, an MIM (metal-insulator-metal) capacitor, and the like may be used instead of the capacitor. Also, the transmission line resonator is not either limited to a microstrip line resonator, but the present invention can be applied, for example, to a slot line resonator and a coplanar line resonator.

What is claimed is:

1. A high frequency oscillator comprising:
a transmission line resonator;
a pair of active devices for oscillation connected to a pair of resonant wave points, respectively, on said transmission line resonator, said resonant wave points being in an opposite phase relationship to each other;
a pair of negative resistance elements, each of said pair of negative resistance elements being connected to one of said pair of active devices; and
a combiner line connected to an electric symmetric point of said transmission line resonator,
wherein said pair of active devices constitute a pair of oscillation systems which share said transmission line resonator as a high frequency resonator, and said combiner line is configured to combine outputs from said pair of oscillation systems to generate a high frequency output.

2. The high frequency oscillator according to claim 1, wherein said combiner line is a transmission line for combining the outputs of said active devices in opposite phase.

3. The high frequency oscillator according to claim 1, wherein said combiner line is a transmission line for combining the outputs of said active devices in phase.

4. The high frequency oscillator according to claim 1, wherein said transmission line resonator is a microstrip line resonator.

5. The high frequency oscillator according to claim 4, wherein said microstrip line resonator is a line resonator.

6. The high frequency oscillator according to claim 5, wherein said resonant wave points are both ends of said line resonator.

7. The high frequency oscillator according to claim 6, wherein said electric symmetric point is a midpoint of said line resonator.

8. The high frequency oscillator according to claim 5, wherein said line resonator has a line length substantially equal to one half of a wavelength corresponding to a fundamental frequency of oscillation.

9. The high frequency oscillator according to claim 1, further comprising a voltage variable capacitive element for changing an electric length of said transmission line resonator.

10. The high frequency oscillator according to claim 1, further comprising a microstrip line which has a line length equal to one quarter of a wavelength corresponding to a fundamental frequency of oscillation, said microstrip line being connected to said electric symmetric point.

11. A high frequency oscillator comprising:
a transmission line resonator;
a pair of active devices for oscillation connected to a pair of resonant wave points, respectively, on said transmission line resonator, said resonant wave points being in an opposite phase relationship to each other; and
a combiner line connected to an electric symmetric point of said transmission line resonator,
wherein said pair of active devices constitute a pair of oscillation systems which share said transmission line resonator as a high frequency resonator, and said combiner line is configured to combine outputs from said pair of oscillation systems to generate a high frequency output,
wherein said transmission line resonator is a microstrip line resonator, and
wherein said microstrip line resonator is a ring resonator with an uninterrupted annular ring structure with a length of one wavelength corresponding to a fundamental frequency of the pair of active devices for oscillation.

12. The high frequency oscillator according to claim 11, wherein said ring resonator has a line length substantially equal to a wavelength corresponding to a fundamental frequency of oscillation.

13. The high frequency oscillator according to claim 11, wherein said resonant wave points are located at two points which oppose across a diameter of said ring resonator.

14. The high frequency oscillator according to claim 13, wherein said electric symmetric point is a midpoint of said pair of resonant wave points in said ring resonator.

15. A high frequency oscillator comprising:
a transmission line resonator;
a pair of active devices for oscillation connected to a pair of resonant wave points, respectively, on said transmission line resonator, said resonant wave points being in an opposite phase relationship to each other; and
a combiner line connected to an electric symmetric point of said transmission line resonator,
wherein said pair of active devices constitute a pair of oscillation systems which share said transmission line resonator as a high frequency resonator, and said combiner line is configured to combine outputs from said pair of oscillation systems to generate a high frequency output, and further comprising means for injecting a synchronizing signal to said combiner line.

16. A high frequency oscillator comprising:

a transmission line resonator;

a pair of active devices for oscillation connected to a pair of resonant wave points, respectively, on said transmission line resonator, said resonant wave points being in an opposite phase relationship to each other; and a combiner line connected to an electric symmetric point of said transmission line resonator, wherein said pair of active devices constitute a pair of oscillation systems which share said transmission line resonator as a high frequency resonator, and said combiner line is configured to combine outputs from said pair of oscillation systems to generate a high frequency output, and wherein each of said active device is an FET having a grounded source.

17. A high frequency oscillator comprising a first and a second high frequency oscillation unit, each of said first and second high frequency oscillation units comprising:
  a transmission line resonator;
  a pair of active devices for oscillation connected to a pair of resonant wave points, respectively, on said transmission line resonator, said resonant wave points being in an opposite phase relationship to each other, said pair of active devices constituting a pair of oscillation systems which share said transmission line resonator as a high frequency resonator; and
  a combiner line connected to an electric symmetric point of said transmission line resonator, said combiner line being configured to combine outputs from said pair of oscillation systems to generate a high frequency output,
  wherein said combiner lines of said first and second high frequency oscillation units are connected to each other to form a common combiner line, and said high frequency oscillator further comprises a second combiner line connected to an electric symmetric point of said common combiner line.

18. The high frequency oscillator according to claim 17, wherein said transmission line resonator is a line resonator having a microstrip line structure.

19. The high frequency oscillator according to claim 17, wherein said transmission line resonator is a ring resonator having a microstrip line structure.

20. A high frequency oscillator comprising:

a ring resonator having a microstrip line structure;

active devices for oscillation connected to said ring resonator respectively at four points at which a line length of said ring resonator is equally divided four;

a first combiner line connecting one pair of said active devices which oppose to each other across the ring resonator;

a second combiner line connecting the other pair of said active devices which oppose to each other across the ring resonator; and a line connected to an intersection between said first and second combiner lines and having a line length equal to one eighth of a line length of said ring resonator.

21. The high frequency oscillator according to claim 15, wherein said combiner line is a transmission line for combining the outputs of said active devices in opposite phase.

22. The high frequency oscillator according to claim 15, wherein said combiner line is a transmission line for combining the outputs of said active devices in phase.

23. The high frequency oscillator according to claim 15, wherein said transmission line resonator is a microstrip line resonator.

24. The high frequency oscillator according to claim 23, wherein said microstrip line resonator is a line resonator.

25. The high frequency oscillator according to claim 23, wherein said microstrip line resonator is a ring resonator.

26. The high frequency oscillator according to claim 15, further comprising a voltage variable capacitive element for changing an electric length of said transmission line resonator.

27. The high frequency oscillator according to claim 15, further comprising a microstrip line which has a line length equal to one quarter of a wavelength corresponding to a fundamental frequency of oscillation, said microstrip line being connected to said electric symmetric point.

28. The high frequency oscillator according to claim 16, wherein said combiner line is a transmission line for combining the outputs of said active devices in opposite phase.

29. The high frequency oscillator according to claim 16, wherein said combiner line is a transmission line for combining the outputs of said active devices in phase.

30. The high frequency oscillator according to claim 16, wherein said transmission line resonator is a microstrip line resonator.

31. The high frequency oscillator according to claim 30, wherein said microstrip line resonator is a line resonator.

32. The high frequency oscillator according to claim 30, wherein said microstrip line resonator is a ring resonator.

33. The high frequency oscillator according to claim 16, further comprising a voltage variable capacitive element for changing an electric length of said transmission line resonator.

34. The high frequency oscillator according to claim 16, further comprising a microstrip line which has a line length equal to one quarter of a wavelength corresponding to a fundamental frequency of oscillation, said microstrip line being connected to said electric symmetric point.

* * * * *

UNITED STATES PATENT AND TRADEMARK OFFICE
CERTIFICATE OF CORRECTION

PATENT NO.      : 6,798,305 B2
DATED           : September 28, 2004
INVENTOR(S)     : M. Aikawa et al.

It is certified that error appears in the above-identified patent and that said Letters Patent is hereby corrected as shown below:

<u>Title page,</u>
Item [73], Assignees, should read as follows:
-- [73]   Assignees: Nihon Dempa Kogyo Co., Ltd., Tokyo
          (JP); Masayoshi Aikawa, Kanagawa (JP) --

Signed and Sealed this

Twenty-fourth Day of May, 2005

JON W. DUDAS
*Director of the United States Patent and Trademark Office*